US012219819B2

(12) United States Patent
Fan et al.

(10) Patent No.: US 12,219,819 B2
(45) Date of Patent: Feb. 4, 2025

(54) DISPLAY SUBSTRATE, MANUFACTURING METHOD THEREOF, AND DISPLAY APPARATUS

(71) Applicant: BOE Technology Group Co., Ltd., Beijing (CN)

(72) Inventors: Xing Fan, Beijing (CN); Shantao Chen, Beijing (CN); Xin Li, Beijing (CN); Hao Gao, Beijing (CN); Cheng Han, Beijing (CN); Yansong Li, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 437 days.

(21) Appl. No.: 17/633,219

(22) PCT Filed: Apr. 26, 2021

(86) PCT No.: PCT/CN2021/090012
§ 371 (c)(1),
(2) Date: Feb. 7, 2022

(87) PCT Pub. No.: WO2022/226737
PCT Pub. Date: Nov. 3, 2022

(65) Prior Publication Data
US 2023/0363208 A1 Nov. 9, 2023

(51) Int. Cl.
H10K 59/122 (2023.01)
H10K 59/12 (2023.01)
(Continued)

(52) U.S. Cl.
CPC ....... *H10K 59/122* (2023.02); *H10K 59/1201* (2023.02); *H10K 59/873* (2023.02); *H10K 2102/351* (2023.02)

(58) Field of Classification Search
CPC ............. H10K 59/122; H10K 59/1201; H10K 59/873; H10K 2102/351
See application file for complete search history.

(56) References Cited

U.S. PATENT DOCUMENTS

2007/0023790 A1 2/2007 Ohnuma et al.
2013/0187163 A1 7/2013 Kim et al.
(Continued)

FOREIGN PATENT DOCUMENTS

CN 1905165 A 1/2007
CN 103219354 A 7/2013
(Continued)

*Primary Examiner* — Anne M Hines
(74) *Attorney, Agent, or Firm* — Ling Wu; Stephen Yang; Ling and Yang Intellectual Property

(57) ABSTRACT

A display substrate includes a first electrode layer, a pixel define layer, an organic light-emitting layer, a second electrode layer and a first encapsulation layer which are sequentially disposed away from an base substrate. The pixel define layer has a plurality of openings, at least one of which exposes the first electrode layer. The pixel define layer has a first climbing part and a second climbing part close to the edge of at least one opening, the distance from a surface of the second climbing part away from the base substrate to the base substrate is greater than the distance from a surface of the first climbing part away from the base substrate to the base substrate, and the slope angle of the first climbing part is different from that of the second climbing part.

16 Claims, 8 Drawing Sheets

(51) Int. Cl.
*H10K 59/80* (2023.01)
*H10K 102/00* (2023.01)

(56) References Cited

U.S. PATENT DOCUMENTS

| | | |
|---|---|---|
| 2015/0060820 A1 | 3/2015 | Takagi et al. |
| 2015/0200234 A1 | 7/2015 | Kim |
| 2016/0226013 A1 | 8/2016 | Liu et al. |
| 2018/0011385 A1 | 1/2018 | Kang et al. |
| 2019/0237524 A1 | 8/2019 | Chen et al. |
| 2019/0386250 A1 | 12/2019 | Suzuki |
| 2020/0168677 A1 | 5/2020 | Gao et al. |
| 2020/0279896 A1 | 9/2020 | Cao |
| 2021/0013452 A1 | 1/2021 | Kim et al. |

FOREIGN PATENT DOCUMENTS

| | | |
|---|---|---|
| CN | 104425766 A | 3/2015 |
| CN | 108400146 A | 8/2018 |
| CN | 108761999 A | 11/2018 |
| CN | 109136834 A | 1/2019 |
| CN | 109873089 A | 6/2019 |
| CN | 112216726 A | 1/2021 |
| CN | 112885885 A | 6/2021 |

DISPLAY SUBSTRATE, MANUFACTURING METHOD THEREOF, AND DISPLAY APPARATUS

CROSS-REFERENCE TO RELATED APPLICATIONS

The present application is a U.S. National Phase Entry of International Application No. PCT/CN2021/090012 having an international filing date of Apr. 26, 2021. The above-identified application is hereby incorporated by reference.

TECHNICAL FIELD

The present disclosure relates to, but not limited to, the field of display technology, and particularly to a display substrate, a manufacturing method thereof, and a display apparatus.

BACKGROUND

As an active light-emitting display device, an Organic Light-emitting Diode (OLED) has the advantages of self-illumination, wide viewing angle, high contrast, low power consumption, extremely quick response, etc. With the continuous development of a display technology, a display apparatus that adopts an OLED as a light-emitting device and adopts a Thin Film Transistor (TFT) for signal control has become a mainstream product in the field of display at present.

SUMMARY

The below is a summary about the subject matter described in the present disclosure in detail. The summary is not intended to limit the scope of protection of the claims.

The embodiments of the present disclosure provide a display substrate, a manufacturing method thereof, and a display apparatus.

According to one aspect, the embodiment of the present disclosure provides a display substrate including a first electrode layer, a pixel definition layer, an organic light-emitting layer, a second electrode layer and a first encapsulation layer which are sequentially disposed away from a base substrate. The pixel definition layer has a plurality of openings, at least one of which exposes the first electrode layer. The pixel definition layer has a first climbing part and a second climbing part close to the edge of at least one opening, the distance from a surface of the second climbing part away from the base substrate to the base substrate is greater than the distance from a surface of the first climbing part away from the base substrate to the base substrate, and the slope angle of the first climbing part is different from that of the second climbing part. The first encapsulation layer has a first encapsulation climbing part and a second encapsulation climbing part, the distance from a surface of the second encapsulation climbing part away from the base substrate to the base substrate is greater than the distance from a surface of the first encapsulation climbing part away from the base substrate to the base substrate, and the slope angle of the first encapsulation climbing part is different from that of the second encapsulation climbing part. The slope angle is an included angle between the tangent of the climbing part and a plane parallel to the base substrate.

In some exemplary implementations, the slope angle of the first climbing part is less than that of the second climbing part.

In some exemplary implementations, the orthographic projection of the first encapsulation climbing part on the base substrate at least partially is overlapped with the orthographic projection of the first climbing part on the base substrate.

In some exemplary implementations, the first climbing part has at least one first step. The orthographic projection of the first encapsulation climbing part of the first encapsulation layer on the base substrate is at least partially overlapped with the orthographic projection of the first step on the base substrate.

In some exemplary implementations, the first step has a first flat part and a first slope, and the first flat part is connected between the first slope and the second climbing part.

In some exemplary implementations, the slope angle of the first slope is approximately equal to the slope angle of the second climbing part.

In some exemplary implementations, in a plane parallel to the display substrate, a first length of the first flat part is less than a first length of the adjacent opening. The first length is the dimension along a first direction, and the first direction is parallel to the plane where the base substrate is located and is intersected with the center line of the opening.

In some exemplary embodiments, the thickness of the first the encapsulation layer is about 600 nanometers to 3 microns. In the direction perpendicular to the base substrate, the distance from the surface of the first flat part away from the base substrate to the first electrode layer is greater than or equal to 200 nanometers.

In some exemplary implementations, the pixel define layer further has a second flat part close to the edge of at least one opening, and the second flat part is connected with the second climbing part; the distance from the surface of the second flat part away from the base substrate to the base substrate is greater than that of the second climbing part away from the base substrate to the base substrate.

In some exemplary implementations, the orthographic projection of the second flat part on the base substrate at least partially is not overlapped with the orthographic projection of the second climbing part on the base substrate.

In some exemplary implementations, the orthographic projection of the second flat part on the base substrate contains the orthographic projection of the second climbing part on the base substrate.

In some exemplary implementations, the first climbing part has a plurality of first steps sequentially disposed in a direction away from adjacent openings. The first encapsulation layer further has at least one third encapsulation climbing part connected between the second encapsulation climbing part and the first encapsulation climbing part. The orthographic projection of the third encapsulation climbing part on the base substrate is overlapped with the orthographic projection of at least one first step on the base substrate.

In some exemplary implementations, the pixel define layer includes a first pixel define layer and a second pixel define layer which are stacked, wherein the first pixel define layer has a plurality of first openings and the second pixel define layer has a plurality of second openings, and the plurality of first openings and the plurality of second openings are correspondingly communicated one by one and expose the first electrode layer. The first pixel define layer has at least a first climbing part close to an edge of at least one first opening, and the second pixel define layer has at least a second climbing part close to an edge of at least one second opening.

In some exemplary implementations, the material of the first pixel define layer is different from that of the second pixel define layer.

In some exemplary implementations, the first encapsulation layer further has a first encapsulation flat part and a second encapsulation flat part, wherein the first encapsulation flat part is connected with the first encapsulation climbing part and the second encapsulation flat part is connected with the second encapsulation climbing part. The distance from a surface of the first encapsulation flat part away from the base substrate to the base substrate is less than that of a surface of the first encapsulation climbing part away from the base substrate to the base substrate; the distance from a surface of the second encapsulation flat part away from the base substrate to the base substrate is greater than that of a surface of the second encapsulation climbing part away from the base substrate to the base substrate.

In some exemplary implementations, the display substrate further comprise a second encapsulation layer located at a side of the first encapsulation layer away from the base substrate. The first encapsulation layer is made of inorganic material, the second encapsulation layer is made of organic material, and the refractive index of the first encapsulation layer is higher than that of the second encapsulation layer.

In some exemplary implementations, the refractive index of the pixel define layer ranges from about 1.4 to 2, and the refractive index of the first encapsulation layer ranges about 1.45 to 2.2.

According to another aspect, an embodiment of the present disclosure provides a display device, which includes the abovementioned display substrate.

On the other hand, the embodiment of the present disclosure provides a manufacturing method for a display substrate, which comprises the following steps: forming a first electrode layer, a pixel define layer, an organic light-emitting layer, a second electrode layer and a first encapsulation layer on a base substrate in sequence. Wherein, the pixel define layer has a plurality of openings, at least one of which exposes the first electrode layer. The pixel define layer has a first climbing part and a second climbing part close to the edge of at least one opening, the distance from a surface of the second climbing part away from the base substrate to the base substrate is greater than the distance from a surface of the first climbing part away from the base substrate to the base substrate, and the slope angle of the first climbing part is different from that of the second climbing part. The first encapsulation layer has a first encapsulation climbing part and a second encapsulation climbing part, the distance from a surface of the second encapsulation climbing part away from the base substrate to the base substrate is greater than the distance from a surface of the first encapsulation climbing part away from the base substrate to the base substrate, and the slope angle of the first encapsulation climbing part is different from that of the second encapsulation climbing part. The slope angle is an included angle between the tangent of the climbing part and a plane parallel to the base substrate.

After reading and understanding the drawings and the detailed description, other aspects may be understood.

BRIEF DESCRIPTION OF DRAWINGS

The drawings provide a further understanding to the technical solution of the present disclosure, form a part of the specification, and are adopted to explain, together with the embodiments of the present disclosure, the technical solutions of the present disclosure and not intended to form limits to the technical solutions of the present disclosure. The shapes and sizes of one or more components in the drawings do not reflect the true scale, and are only intended to schematically describe the contents of the present disclosure.

DETAILED DESCRIPTION

Figure 1:
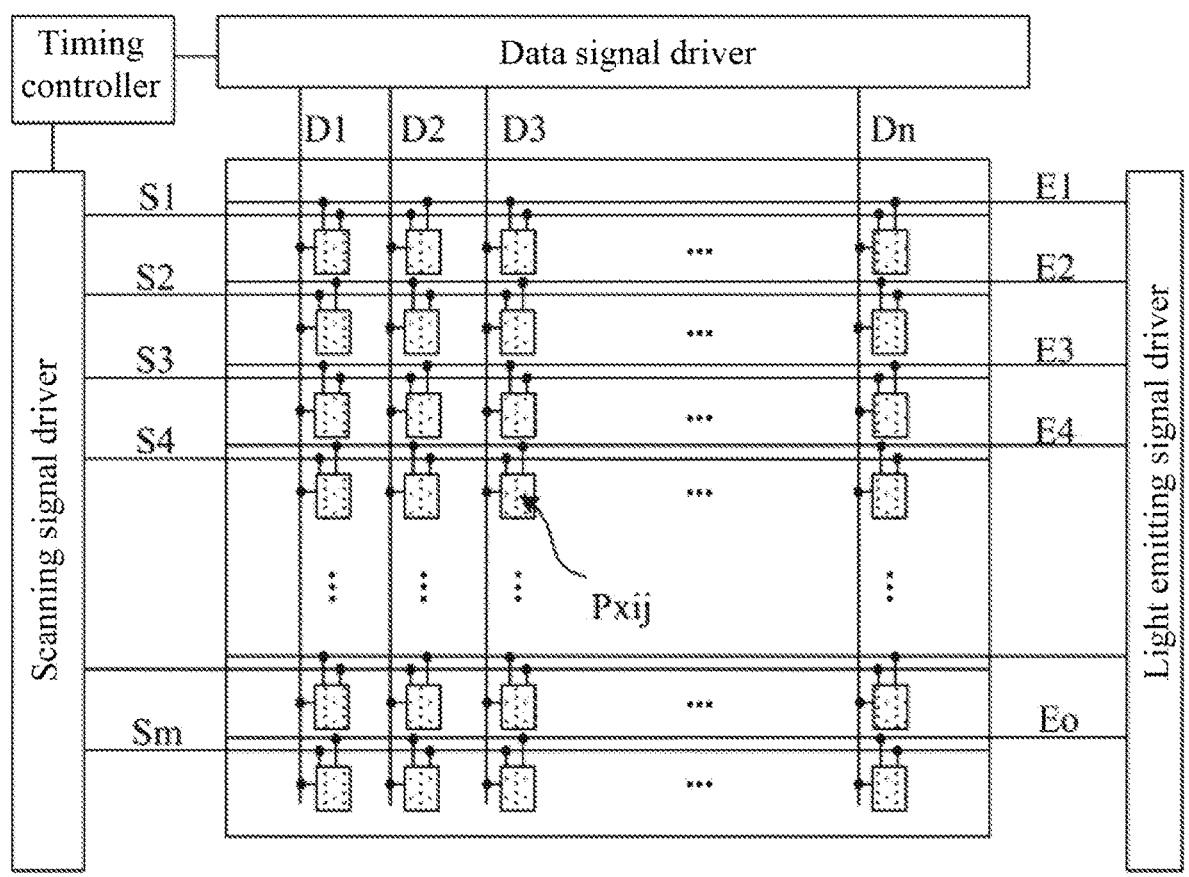
FIG. 1 illustrates a schematic diagram of a structure of a display apparatus.

The embodiments of the present disclosure will be described below in combination with the drawings in detail. Implementations may be implemented in various forms. Those of ordinary skill in the art can easily understand such a fact that manners and contents may be transformed into various forms without departing from the purpose and scope of the present disclosure. Therefore, the present disclosure should not be explained as being limited to the contents recorded in the following implementations only. The embodiments in the present disclosure and the features in the embodiments can be freely combined if there are no conflicts.

In the drawings, the size/sizes of one or more composition elements, the thicknesses of layers, or regions are exaggerated sometimes for clarity. Therefore, an implementation of the present disclosure is not necessarily limited to the size shown, and the shape and size of one or more components in the drawings do not reflect true proportions. In addition, the drawings schematically illustrate ideal examples, and a mode of the present disclosure is not limited to the shapes, numerical values, or the like shown in the drawings.

"First", "second", "third" and other ordinal numerals in the specification are set to avoid the confusion of the constituent elements, rather than to limit the quantity. In the present disclosure, "a plurality of" represents two or more than two.

For convenience, in the specification the terms such as "middle", "up", "down", "front", "back", "vertical", "horizontal", "top", "bottom", "inside" and "outside" indicating the orientation or position relationship are used to describe the position relationship between the constituent elements with reference to the drawings, only for the convenience of describing the specification and simplifying the description, instead of indicating or implying that the device or element referred to must have a specific orientation or be constructed and operated in a specific orientation, so they should not be understood as limitations to the present disclosure. The positional relationships between the composition elements may be changed as appropriate according to the direction where the composition elements are described. Therefore, appropriate replacements based on situations are allowed, not limited to the expressions in the specification.

Unless otherwise specified and limited, in the specification the terms "mount", "connected" and "connect" should be understood in a broad sense. For example, it may be fixed connection, detachable connection or integrated connection, may be mechanical connection or connection, or may be direct connection, indirect connection through intermediate components, or communication inside two components. For those skilled in the art, the meanings of the above terms in the present disclosure may be understood according to the situation.

In the specification, a transistor refers to an element which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. In this specification, the channel region refers to a region which the current mainly flows through.

In the present specification, the first electrode may be the drain electrode, and the second electrode may be the source electrode. Alternatively, the first electrode may be the source electrode, and the second electrode may be the drain electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present specification.

In the present specification, "connection" includes connection of composition elements through an element with a certain electric effect. "The element with a certain electric effect" is not particularly limited as long as electric signals between the connected composition elements may be transmitted. Examples of "the element with a certain electric effect" not only include an electrode and wire, but also a switch element (such as a transistor, etc.), a resistor, an inductor, a capacitor, other elements, etc.

In the specification, "parallel" refers to a state in which an angle formed by two straight lines is more than −10° and less than 10°. Thereby, it also includes a state in which an angle is more than −5° and less than 5°. In addition, "vertical" refers to a state in which an angle formed by two straight lines is more than 800 and less than 100°. Therefore, it also includes a state in which an angle is more than 850 and less than 95°.

In the present disclosure, "about" refers to that a boundary is defined not so strictly and numerical values in process and measurement error ranges are allowed.

In the present disclosure, "thickness" refers to the distance between a surface of a film layer away from a base substrate and a surface close to the base substrate.

FIG. 1 illustrates a schematic diagram of a structure of a display apparatus. Referring to FIG. 1, an OLED display apparatus may include a timing controller, a data signal driver, a scanning signal driver, a light-emitting signal driver and a pixel array, and the pixel array may include a plurality of scanning signal lines (e.g., S1 to Sm), a plurality of data signal lines (e.g., D1 to Dn), a plurality of light-emitting signal lines (e.g., E1 to Eo) and a plurality of sub-pixels Pxij. In an exemplary implementations, the timing controller may provide a gray-scale value and a control signal suitable for a specification of the data signal driver to the data signal driver, provide a clock signal and a scan starting signal, etc., suitable for a specification of the scanning signal driver to the scanning signal driver, and provide a clock signal, a transmission stopping signal, etc., suitable for a specification of the light-emitting signal driver for the light-emitting signal driver. The data signal driver may generate data voltages to be provided to the data signal lines D1, D2, D3 . . . and Dn, using the gray-scale values and the control signals received from the timing controller. For example, the data signal driver may sample the gray-scale values by using the clock signal, and apply the data voltages corresponding to the gray-scale values to the data signal lines D1 to Dn in units of sub-pixel rows, wherein n may be a natural number. The scanning signal driver may receive the clock signal, a scan starting signal, etc., from the timing controller to generate a scanning signal to be provided to the scanning lines S1, S2, S3, . . . to Sm. For example, the scanning signal driver may sequentially provide the scanning signal with an on-level pulse to the scanning signal lines S1 to Sm. For example, the scanning signal driver may be constructed in a form of a shift register and sequentially transmit the scan starting signal provided in form of an on-level pulse to a next-stage circuit to generate the scanning signal under the control of the clock signal, where m may be a natural number. The light-emitting signal driver may receive the clock signal, the emission stopping signal, etc., from the timing controller to generate an emission signal to be provided to the light-emitting signal lines E1, E2, E3, . . . to Eo. For example, the light-emitting signal driver may sequentially provide the emission signal with an off-level pulse to the light-emitting signal lines E1 to Eo. For example, the light-emitting signal driver may be constructed in a form of a shift register and can sequentially transmit a light-emitting stopping signal provided in form of an off-level pulse to a next-stage circuit to generate the light-emitting signal under the control of the clock signal, where o may be a natural number. The pixel array may include a plurality of sub-pixels Pxij. Each sub-pixel Pxij may be connected to a corresponding data signal line, a corresponding scanning signal line, and a corresponding light-emitting signal line, where i and j may be natural numbers. The sub-pixel Pxij may refer to a sub-pixel in which a transistor is connected to an ith scanning signal line as well as a jth data signal line.

Figure 2:
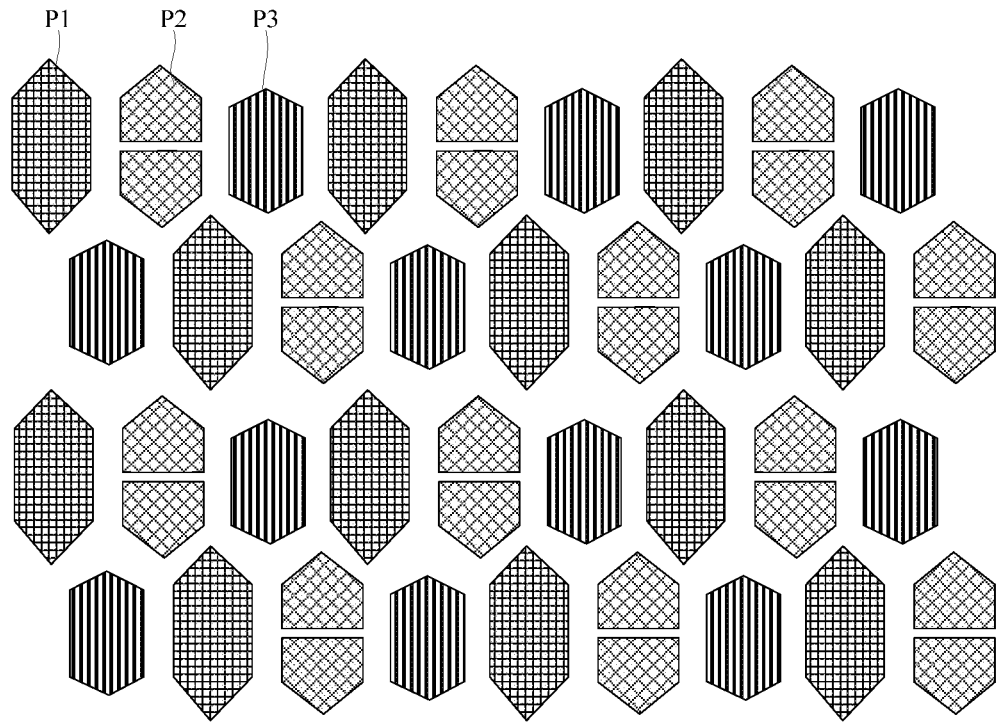
FIG. 2 illustrates a schematic diagram of a planar structure of a display substrate.

FIG. 2 illustrates a schematic diagram of a planar structure of a display substrate. As shown in FIG. 2, in a direction parallel to the display substrate, the plurality of sub-pixels in the display area may be arranged, on each row, in a form of a repeating unit including one first sub-pixel P1, two second sub-pixels P2 and one third sub-pixel P3, wherein the two second sub-pixels P2 in the repeating unit are arranged in the column direction. Wherein, the first sub-pixels P1 emit first-color light, the second sub-pixels P2 emit second-color light, and the third sub-pixels P3 emit third-color light. In some examples, the repetitive units between two adjacent rows are shifted in the row direction. The two second sub-pixels P2 may be pentagons (e.g., rounded pentagons), and the two second sub-pixels P2 are symmetrical with each other, and the axis of symmetry is parallel to the row direction. The first sub-pixel P1 and the third sub-pixel P3 are hexagons (e.g., rounded hexagons), respectively. The length of the first sub-pixel P1 in the column direction may be greater than that of the third sub-pixel P3 in the column direction, and the length of the third sub-pixel P3 in the column direction may be greater than that of the second sub-pixel P2 in the column direction. In some examples, the first sub-pixel P1 may be a red (R) sub-pixel, the second sub-pixel P2 may be a green (G) sub-pixel, and the third sub-pixel P3 may be a blue (B) sub-pixel. Accordingly, the first-color light may be red light, the second-color light may be green light, and the third-color light may be blue light. In this example, the three sub-pixels of a pixel unit are arranged in a delta shape. However, shape and arrangement mode of the plurality of sub-pixels in the display area are not limited in the present embodiment. For example, the sub-pixels may be rectangular, rhombic, pentagonal or hexagonal. In some examples, when a pixel unit includes three sub-pixels, the three sub-pixels may be arranged in parallel in a horizontal direction, or in parallel in a vertical direction; when a pixel unit includes four sub-pixels, the four sub-pixels may be arranged in parallel in the horizontal direction, in parallel in the vertical direction, or in a square.

In some examples, each of the first sub-pixel P1, the second sub-pixel P2 and the third sub-pixel P3 includes a pixel driving circuit and a light-emitting element. The pixel driving circuits in the first sub-pixel P1, the second sub-pixel P2, and the third sub-pixel P3 are connected with the scanning signal line, the data signal line, and the light-emitting signal line respectively. The pixel driving circuit is configured to, under the control of the scanning signal line and the light-emitting signal line, receive a data voltage transmitted by the data signal line and output a corresponding current to the light-emitting element. The light-emitting elements in the first sub-pixel P1, the second sub-pixel P2, and the third sub-pixel P3 are connected with the pixel driving circuits of the corresponding sub-pixels respectively. The light-emitting element is configured to emit light of corresponding luminance responsive to the current output by the pixel driving circuit of the corresponding sub-pixel.

Figure 3:
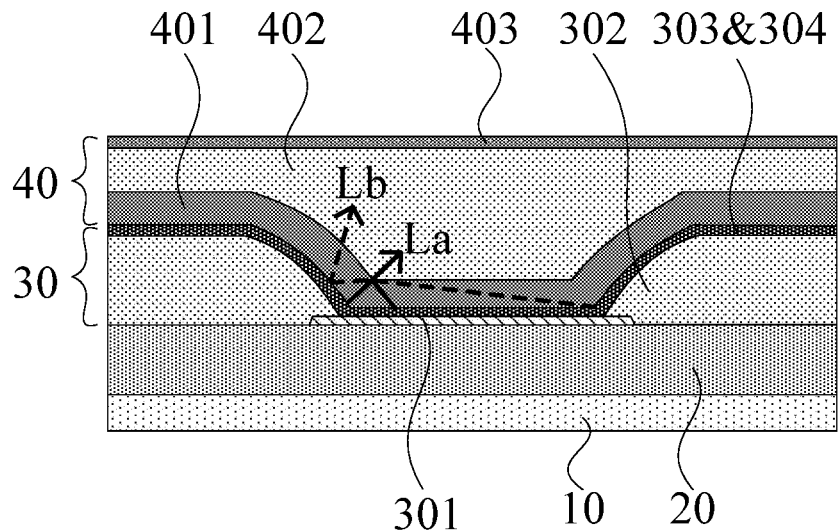
FIG. 3 illustrates a schematic diagram of a sectional structure of a display substrate.

FIG. 3 is a schematic sectional view of a display substrate, illustrating a structure of a sub-pixel in an OLED display substrate. As shown in FIG. 3, on a direction perpendicular to the display substrate, the display substrate may include an base substrate 10, a drive circuit layer 20 disposed on the base substrate 10, a light-emitting structure layer 30 disposed on a side of the drive circuit layer 20 away from the base substrate 10, and an encapsulation layer 40 disposed on a side of the light-emitting structure layer 30 away from the base substrate 10. In some possible implementations, the display substrate may include other film layers, such as post spacers, which is not limited in the present disclosure.

In some examples, the driving circuit layer 20 of each sub-pixel may include a plurality of transistors and storage capacitors forming a pixel driving circuit. For example, the pixel driving circuit may be of a 3T1C (i.e., three thin film transistors and one capacitor), a 4T1C (i.e., four thin film transistors and one capacitor), a 5T1C (i.e., five thin film transistors and one capacitor), a 5T2C (i.e., five thin film transistors and two capacitors), or a 7T1C (i.e., seven thin film transistors and one capacitor) structure. The light-emitting structure layer 30 includes a pixel define layer 302 and a plurality of light-emitting elements. At least one light-emitting element includes a first electrode 301, a second electrode 304, and an organic light-emitting layer disposed between the first electrode and the second electrode. For example, the first electrode 301 may be a total reflective anode and the second electrode 304 may be a semi-reflective cathode. The first electrode 301 is located on a side of the second electrode 304 close to the base substrate 10. The first electrode 301 may be connected to the pixel driving circuit of the driving circuit layer 20 by a via hole, the organic light-emitting layer 303 may be connected to the first electrode 301, the second electrode 304 may be connected to the organic light-emitting layer 303, and the organic light-emitting layer 303 emits light of a corresponding color under the drive of the first electrode 301 and the second electrode 304. The encapsulation layer 40 may include a first encapsulation layer 401, a second encapsulation layer 402 and a third encapsulation layer 403 that are stacked together; the first encapsulation layer 401 and the third encapsulation layer 403 may be made of an inorganic material, and the second encapsulation layer 402 may be made of an organic material; the second encapsulation layer 402 is disposed between the first encapsulation layer 401 and the third encapsulation layer 403 to ensure that external moisture cannot enter into the light-emitting element.

Figure 4:
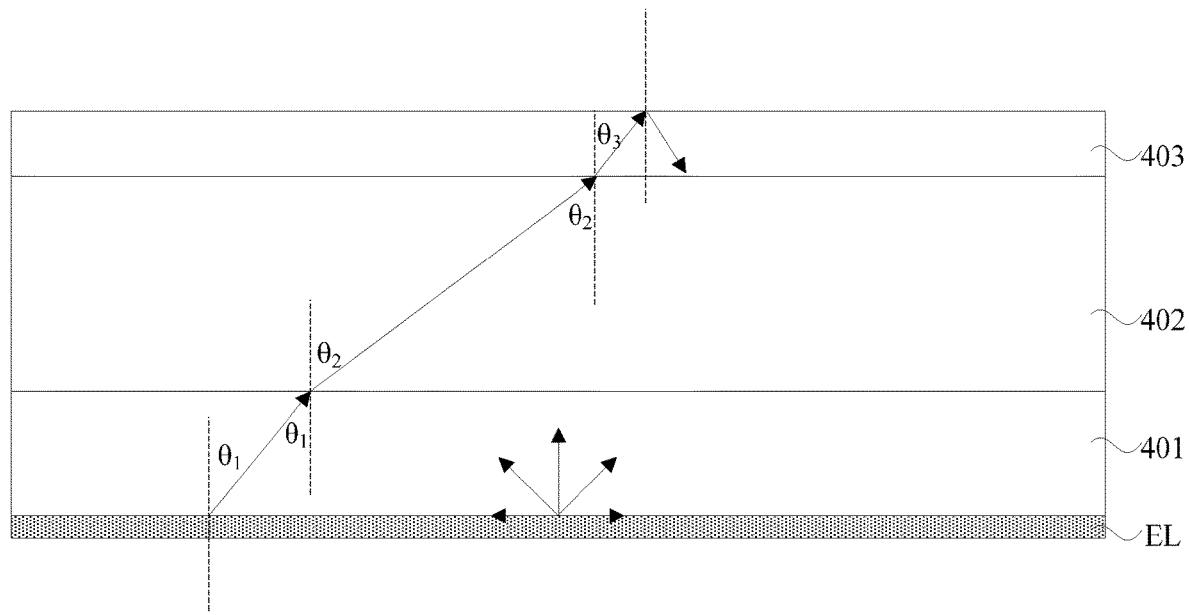
FIG. 4 is a schematic diagram of light emission from a light-emitting element in a planar structure.

FIG. 4 is a schematic diagram of light emission from a light-emitting element in a planar structure. As shown in FIG. 4, light emitted by a light-emitting element EL passes through a first encapsulation layer 401, a second encapsulation layer 402 and a third encapsulation layer 403 sequentially and then emits into air. The total reflection conditions of light entering the encapsulation layer are as follows:

$$N_1 \sin \theta_1 = N_2 \sin \theta_2 = n_3 \sin \theta_3 = n_{air} \cdot \sin 90°.$$

Where $n_1$ is the refractive index of the first encapsulation layer 401, $n_2$ is the refractive index of the second encapsulation layer 402, $n_3$ is the refractive index of the third encapsulation layer 403, $\theta_1$ is the incident angle of the second encapsulation layer 402, $\theta_2$ is the incident angle of the third encapsulation layer 403 and $\theta_3$ is the incident angle of entering air.

Therefore, when the refractive index $n_1$ of the first encapsulation layer 401 is about 1.75 and the refractive index $n_2$ of the second encapsulation layer 402 is about 1.5, the critical angle of total reflection of light entering the first encapsulation layer 401 from the light-emitting element EL at the interface of the second encapsulation layer 402 may be calculated as follows: $\theta_1 = \arcsin(1.5/1.75) \approx 59°$. Therefore, when the angle of the light entering the first encapsulation layer 401 from the light-emitting element EL is about 59 degrees, the light would be totally reflected and confined in the encapsulation layer, and this portion of waveguide light has a greater spectral peak width than that of the light that may be emitted normally. For purely planar light-emitting elements, this portion of waveguide light cannot be emitted. However, as shown in FIG. 3, due to a slope of the pixel define layer 302, the total reflection waveguide light in the first encapsulation layer 401 would be reflected in a specific area of the pixel define layer 302 and then emitted, and this portion of the total reflection waveguide light would be superimposed with the normally emitted light of the light-emitting element EL, resulting in serious color shift in a large viewing angle. For example, in FIG. 3, the first influence light La and a second influence light Lb are reflected by the slope of the pixel define layer 302 and then emitted. Herein, the first influence light La represents the light emitted from the position close to the adjacent pixel define layer 302 in the light-emitting area of the sub-pixel, and the second influence light Lb represents the light emitted from the position away from the adjacent pixel define layer 302 in the light-emitting area of the sub-pixel, and the intensity of the first influence light La is higher than that of the second influence light Lb.

At least one embodiment of the present disclosure provides a display substrate including a first electrode layer, a pixel define layer, an organic light-emitting layer, a second electrode layer and a first encapsulation layer which are sequentially disposed away from an base substrate. The pixel define layer has a plurality of openings, at least one of which exposes the first electrode layer. The pixel define layer has a first climbing part and a second climbing part close to the edge of at least one opening. The distance from a surface of the second climbing part away from the base substrate to the base substrate is greater than the distance from a surface of the first climbing part away from the base substrate to the base substrate, and the slope angle of the first climbing part is different from that of the second climbing part. The first encapsulation layer has a first encapsulation climbing part and a second encapsulation climbing part. The distance from a surface of the second encapsulation climbing part away from the base substrate to the base substrate is greater than the distance from a surface of the first encapsulation climbing part away from the base substrate to the base substrate, and the slope angle of the first encapsulation climbing part is different from that of the second encapsulation climbing part. Herein, the slope angle is an angle between the tangent of the climbing part and a plane parallel to the base substrate.

According to the display substrate provided by the embodiment, by changing the morphology of the pixel define layer and the first encapsulation layer, the waveguide light in the first encapsulation layer cannot be emitted, thereby alleviating color shift in a large viewing angle of the display substrate.

In some exemplary implementations, the slope angle of the first climbing part may be less than that of the second climbing part. In the exemplary implementations, by setting the slope angle of the first climbing part to be less than that of the second climbing part, the influence light reflected by the first encapsulation layer and the pixel define layer may contact reflection surfaces of the first encapsulation layer and the second encapsulation layer in a large angle, so that the influence light is confined in the encapsulation layer, avoiding color shift in a large viewing angle caused by emission.

In some exemplary implementations, the orthographic projection of the first encapsulation climbing part on the base substrate are at least partially overlapped with the orthographic projection of the first climbing part on the base substrate. In the exemplary implementation, the morphology of the first encapsulation layer matches that of the pixel define layer. The morphology of the first encapsulation layer changes according to the morphology of the pixel define layer.

In some exemplary implementations, the first climbing part has at least one first step. The orthographic projection of the first encapsulation climbing part of the first encapsulation layer on the base substrate are at least partially overlapped with the orthographic projection of the first step on the base substrate. In this exemplary implementation, the color shift in the large viewing angle is alleviated by adjusting, by at least one first step, the direction of the influencing light reflected by the first encapsulation layer and the pixel define layer.

In some exemplary implementations, the first step has a first flat part and a first slope, and the first flat part is connected between the first slope and the second climbing part. In this exemplary implementation, with the reflection of the first flat part of the first step, the influencing light may contact the reflection surfaces of the first encapsulation layer and the second encapsulation layer in a large angle, thereby alleviating the color shift at a large viewing angle.

In some exemplary implementations, the slope angle of the first slope is approximately equal to the slope angle of the second climbing part. However, the present embodiment is not limited thereto. For example, the slope angle of the first slope may be less than that of the second climbing part.

In some exemplary implementations, in a direction parallel to the display substrate, a first length of the first flat part is less than a first length of the adjacent opening. Wherein, the first length is the dimension along a first direction, and the first direction is parallel to the plane of the base substrate and is intersected with the center line of the opening.

In some exemplary implementations, a thickness of the first encapsulation layer is about 600 nm to 3 mm, e.g., 1 mm; in the direction perpendicular to the base substrate, the distance from the surface of the first flat part away from the base substrate to the first electrode layer is greater than or equal to 200 nm, e.g., 300 nm. However, the present embodiment is not limited thereto.

In some exemplary implementations, the pixel define layer further has a second flat part close to the edge of at least one opening, and the second flat part is connected with the second climbing part; the distance from the surface of the second flat part away from the base substrate to the base substrate is greater than that of the second climbing part away from the base substrate to the base substrate. In this example, the second flat part and the second climbing part form a second step.

In some exemplary implementations, the orthographic projection of the second flat part on the base substrate is not overlapped with the orthographic projection of the second climbing part on the base substrate. For example, in a direction perpendicular to the base substrate, the second step formed by the second climbing part and the second flat part may be trapezoidal. However, the present embodiment is not limited thereto.

In some exemplary implementations, the orthographic projection of the second flat part on the base substrate contains the orthographic projection of the second climbing part on the base substrate. For example, in a direction perpendicular to the base substrate, the second step formed by the second climbing part and the second flat part may be inverted trapezoidal. However, the present embodiment is not limited thereto.

In some exemplary implementations, the first climbing part has a plurality of first steps sequentially disposed in a direction away from adjacent openings. The first encapsulation layer further has at least one third encapsulation climbing part connected between the second encapsulation climbing part and the first encapsulation climbing part. The orthographic projection of the third encapsulation climbing part on the base substrate is overlapped with the orthographic projection of at least one first step on the base substrate.

In some exemplary implementations, the pixel define layer includes a first pixel define layer and a second pixel define layer which are stacked, wherein the first pixel define layer has a plurality of first openings and the second pixel define layer has a plurality of second openings, and the plurality of first openings and the plurality of second openings are correspondingly communicated and expose a first electrode layer. The first pixel define layer has at least a first climbing part close to an edge of at least one first opening, and the second pixel define layer has at least a second climbing part close to an edge of at least one second opening.

In some exemplary implementations, the material of the first pixel define layer is different from that of the second pixel define layer. However, the present embodiment is not limited thereto.

In some exemplary implementations, the first encapsulation layer further has a first encapsulation flat part and a second encapsulation flat part, wherein the first encapsulation flat part is connected with the first encapsulation climbing part and the second encapsulation flat part is connected with the second encapsulation climbing part. The distance from a surface of the first encapsulation flat part away from the base substrate to the base substrate is less than the distance from a surface of the first encapsulation climbing part away from the base substrate to the base substrate. The distance from a surface of the second encapsulation flat part away from the base substrate to the base substrate is greater than the distance from a surface of the second encapsulation climbing part away from the base substrate to the base substrate.

In some exemplary implementations, the display substrate further comprise a second encapsulation layer located at a side of the first encapsulation layer away from the base substrate. The first encapsulation layer is made of inorganic material, the second encapsulation layer is made of organic material, and the refractive index of the first encapsulation layer is higher than that of the second encapsulation layer.

In some exemplary implementations, the refractive index of the pixel define layer ranges from about 1.4 to 2, and the refractive index of the first encapsulation layer ranges about 1.45 to 2.2. However, the present embodiment is not limited thereto.

The solution of the present embodiment will be described below with some examples.

Figure 5:
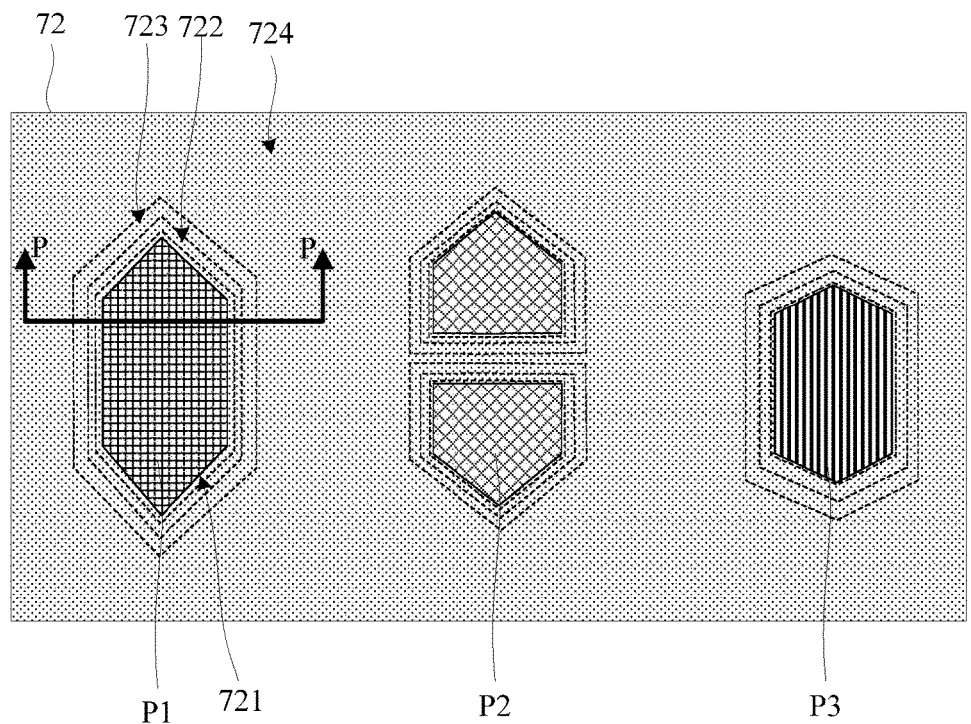
FIG. 5 is a schematic partial plan view of a display substrate according to at least one embodiment of the present disclosure.
Figure 6:
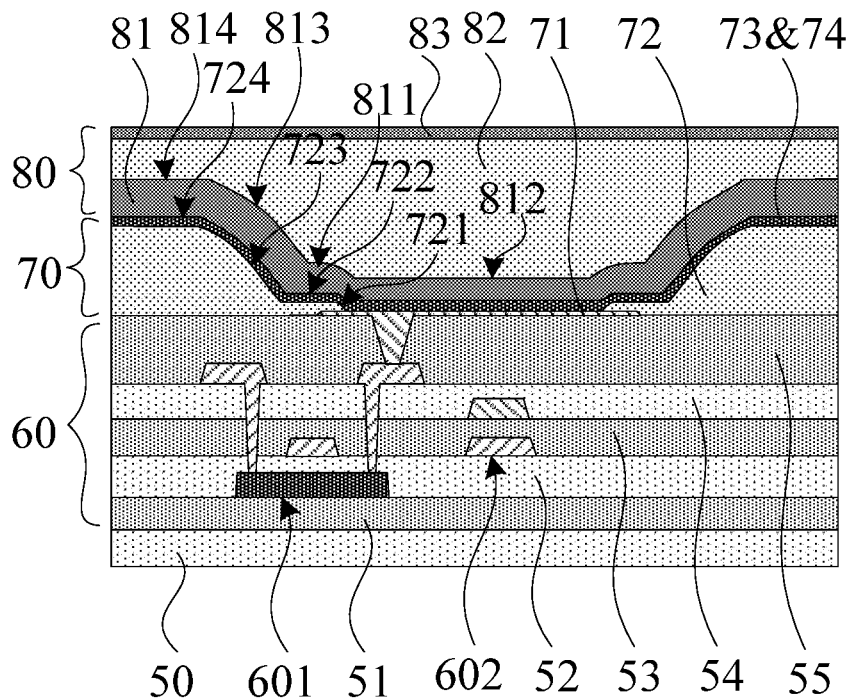
FIG. 6 is a schematic partial sectional view along P-P in FIG. 5.
Figure 7:
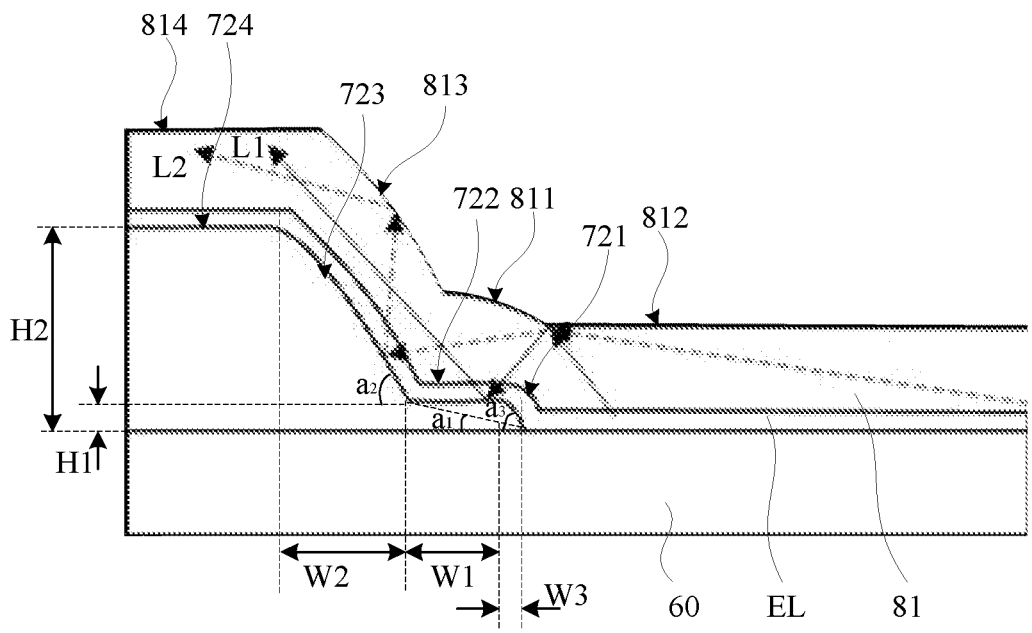
FIG. 7 is a schematic diagram of a light path according to at least one embodiment of the present disclosure.

FIG. 5 is a schematic plan view of a display substrate according to at least one embodiment of the present disclosure, which illustrates four sub-pixels. FIG. 6 is a schematic partial sectional view along P-P direction in FIG. 5, which illustrates a structure of one sub-pixel. FIG. 7 is a schematic diagram of a light path according to at least one embodiment of the present disclosure.

In some exemplary implementations, as shown in FIGS. 5 and 6, in a direction perpendicular to the display substrate, the display substrate includes a base substrate 50, and a driving circuit layer 60, a light-emitting structure layer 70 and an encapsulation layer 80 which are sequentially disposed on the base substrate 50.

In some exemplary implementations, the base substrate 50 may be a flexible base or a rigid base. The driving circuit layer 60 of each sub-pixel may include a plurality of transistors and storage capacitors that form a pixel driving circuit, and only one transistor 601 and one storage capacitor 602 of the sub-pixel are shown in FIG. 6 as an example. In some examples, the driving circuit layer 20 includes a semiconductor layer, a first gate metal layer, a second gate metal layer, and a source-drain metal layer which are disposed on the base substrate 50 sequentially. A first insulating layer 51 is disposed between the semiconductor layer and the base substrate 50, a second insulating layer 52 is disposed between the semiconductor layer and the first gate metal layer, a third insulating layer 53 is disposed between the first gate metal layer and the second gate metal layer, a fourth insulating layer 54 is disposed between the second gate metal layer and the source-drain metal layer, and a fifth insulating layer 55 is disposed on a side of the source-drain metal layer away from the base substrate 50. The semiconductor layer at least includes a first active layer of the first transistor 601, the first gate metal layer at least includes a first gate electrode of the first transistor 601 and a first capacitor electrode of the storage capacitor 602, the second gate metal layer at least includes a second capacitor electrode of the storage capacitor 602, and the source-drain metal layer at least includes a first source electrode and the first drain electrode of the first transistor 601. In some examples, the first to fourth insulating layers 51 to 54 may be inorganic insulating layers, and the fifth insulating layer 55 may be an organic insulating layer. However, the present embodiment is not limited thereto.

In some exemplary implementations, the light-emitting structure layer 70 of each sub-pixel includes a pixel define layer 72 and a light-emitting element EL. The light-emitting element EL may include a first electrode 71, an organic light-emitting layer 73 and a second electrode 74 which are stacked. The first electrode 71 is connected to a first drain electrode of the first transistor 601 by a via hole, the organic light-emitting layer 73 is connected to the first electrode 71, the second electrode 74 is connected to the organic light-emitting layer 73, and the organic light-emitting layer 73 emits light of a corresponding color under the drive of the first electrode 71 and the second electrode 74.

In some exemplary implementations, the organic light-emitting layer 73 may include a Hole Injection Layer (HIL), Hole Transport Layer (HTL), Electron Block Layer (EBL), Emitting Layer (EML), Hole Block Layer (HBL), Electron Transport Layer (ETL), and Electron Injection Layer (EIL) which are stacked. In some examples, the hole injection layers of all the sub-pixels may be connected together to form a through layer; the electron injection layers of all the sub-pixels may be connected together to form a through layer; the hole transport layers of all the sub-pixels may be connected together to form a through layer; the electron transport layers of all the sub-pixels may be connected together to form a through layer; the hole block layers of all the sub-pixels may be connected together to form a through layer; the light-emitting layers of adjacent sub-pixels may be overlapped slightly, or may be isolated from each other; the electron block layers of the adjacent sub-pixels may be overlapped slightly, or may be isolated from each other.

In some exemplary implementations, as shown in FIG. 6, the pixel define layer 72 is located on a side of the first electrode 71 away from the base substrate 50. The pixel define layer 71 has an opening exposing a surface of the first electrode 71. The part of the light-emitting element EL located at the opening of the pixel define layer 71, which is the light-emitting region of the light-emitting element EL, is used for emitting light. As shown in FIGS. 6 and 7, the pixel define layer 71 has a first climbing part, a second climbing part 723 and a second flat part 724 connected sequentially at an edge close to the opening. The first climbing part has a first step. The first step has a first slope 721 and a first flat part 722 which are sequentially disposed in a direction away from an adjacent opening. The first flat part 722 is connected between the first slope 721 and the second climbing part 723. The second climbing part 723 and the second flat part 724 may form a second step. In this example, the distance from a surface of the first flat part 722 away from the base substrate 50 to the base substrate 50 is greater than that from a surface of the first slope 721 away from the base substrate 50 to the base substrate 50, the distance from a surface of the second climbing part 723 away from the base substrate 50 to the base substrate 50 is greater than that from a surface of the first flat part 722 away from the base substrate 50 to the base substrate 50, and the distance from a surface of the second flat part 724 away from the base substrate 50 to the base substrate 50 is greater than that from a surface of the second climbing part 723 away from the base substrate 50 to the base substrate 50. In this example, when a surface of the climbing part (or flat part or slope) away from the base substrate is not parallel to a plane where the base substrate is located, the distance from a surface of the climbing part (or flat part or slope) away from the base substrate to the base substrate may be an average distance from a surface of the climbing part (or flat part or slope) away from the base substrate to the base substrate. However, the present embodiment is not limited thereto.

In some exemplary implementations, as shown in FIG. 7, the first climbing part has a first slope angle a1, the second climbing part 723 has a second slope angle a2, and the first slope 721 has a third slope angle a3. The slope angle is an angle between the tangent of the climbing part and a plane parallel to the base substrate. In this example, because the first climbing part has the first step, the first slope angle a1 of the first climbing part refers to an angle between the tangent of the imaginary slope formed by an end of the first flat part 722 away from the first slope 721 and an end of the first slope 721 away from the first flat part 722 and the plane parallel to the base substrate (for example, the horizontal plane). The second slope angle a2 of the second climbing part 723 is an angle between the tangent of a plane where the second climbing part 723 is located and the plane parallel to the base substrate. The third slope angle a3 of the first slope 721 is an angle between the tangent of the first slope 721 and the plane parallel to the base substrate. In some examples, the first slope angle a1 may be less than the second slope angle a2, and the second slop angle a2 may be approximately equal to the third slope angle a3. For example, the third slope angle a3 and the second slope angle a2 may each be about 45 degrees. However, the present embodiment is not limited thereto. For example, the second slope angle a2 may be less than the third slope angle a3, alternatively, the second slope angle a2 may be greater than the third slope angle a3.

In some exemplary implementations, as shown in FIGS. 6 and 7, a plane where the first flat part 722 is located and a plane where the second flat part 724 is located may be parallel to each other, and both of them are parallel to a plane where the base substrate 50 is located. However, the present embodiment is not limited thereto. For example, there may be an angle between the plane where the first flat part 722 is located and the plane where the second flat part 724 is located.

In some exemplary implementations, as shown in FIGS. 6 and 7, the orthographic projections of the first slope 721, the first flat part 722, the second climbing part 723 and the second flat part 724 on the base substrate 50 are not overlapped. The orthographic projection of the first slope 721 on the base substrate 50 may be overlapped with an orthographic projection of the first electrode 71 on the base substrate 50. In the plane parallel to the display substrate, as shown in FIG. 5, the orthographic projection of the first slope 721 on the base substrate 50 may be an annular structure surrounding an opening of the pixel define layer 72, the orthographic projection of the first flat part 722 on the base substrate 50 may be an annular structure surrounding the orthographic projection of the first slope 721 on the base substrate 50, and the orthographic projection of the second climbing part 723 on the base substrate 50 may be an annular structure surrounding the orthographic projection of the first flat part 722 on the base substrate 50. Second flat parts 724 located on the periphery of different opening communicate with each other.

In some exemplary implementations, as shown in FIGS. 6 and 7, the first slope 721 and the second climbing part 723 may be inclined arc surfaces. However, the present embodiment is not limited thereto. For example, the first slope 721 and the second climbing part 723 may be inclined planes.

In some exemplary embodiments, as shown in FIG. 6, an encapsulation layer 80 may include a first encapsulation layer 81, a second encapsulation layer 82 and a third encapsulation layer 83 that are stacked together; the first encapsulation layer 81 and the third encapsulation layer 83 may be made of an inorganic material, and the second encapsulation layer 82 may be made of an organic material; the second encapsulation layer 82 is disposed between the first encapsulation layer 81 and the third encapsulation layer 83 to ensure that external vapor may not enter into the light-emitting element EL.

In some exemplary implementations, as shown in FIGS. 6 and 7, the first encapsulation layer 81 may have a first encapsulation flat part 812, a first encapsulation climbing part 811, a second encapsulation climbing part 813 and a second encapsulation flat part 814 connected in sequence. The distance from a surface of the first encapsulation climbing part 811 away from the base substrate 50 to the base substrate 50 is greater than the distance from a surface of the first encapsulation flat part 812 away from the base substrate 50 to the base substrate 50. The distance from a surface of the second encapsulation climbing part 813 away from the base substrate 50 to the base substrate 50 is greater than the distance from a surface of the first encapsulation flat part 812 away from the base substrate 50 to the base substrate 50. The distance from a surface of the second encapsulation flat part 814 away from the base substrate 50 to the base substrate 50 is greater than the distance from a surface of the second encapsulation climbing part 813 away from the base substrate 50 to the base substrate 50. A slope angle of the first encapsulation climbing part 811 is an angle between the tangent of a plane where the first encapsulation climbing part 811 is located and the plane parallel to the base substrate. A slope angle of the second encapsulation climbing part 813 is an angle between the tangent of a plane where the second encapsulation climbing part 813 is located and the plane parallel to the base substrate. The slope angles of the first encapsulation climbing part 811 and the second encapsulation climbing part 813 are different. For example, the slope angle of the first encapsulation climbing part 811 is less than that of the second encapsulation climbing part 813.

In some exemplary implementations, as shown in FIGS. 6 and 7, an orthographic projection of the first encapsulation climbing part 811 on the base substrate 50 is at least partially overlapped with an orthographic projection of the first step of the pixel define layer 72 on the base substrate 50, and the orthographic projection of the first encapsulation climbing part 811 on the base substrate 50 is at least partially overlapped with an orthographic projection of the first flat part 722 on the base substrate 50. For example, the orthographic projection of the first encapsulation climbing part 811 on the base substrate 50 may cover the orthographic projection of the first slope 721 on the base substrate 50 and is partially overlapped with the orthographic projection of the first flat part 722 on the base substrate 50. The orthographic projection of the second encapsulation climbing part 813 on the base substrate 50 is partially overlapped with the orthographic projections of the first flat part 722 and the second climbing part 723 of the pixel define layer 72 on the base substrate 50. The orthographic projection of the second encapsulation flat part 814 on the base substrate 50 is partially overlapped with the orthographic projections of the second climbing part 723 and the second flat part 724 of the pixel define layer 72 on the base substrate 50. However, the present embodiment is not limited thereto.

In some exemplary implementations, as shown in FIGS. 6 and 7, an orthogonal projection of the first encapsulation flat part 812 of the first encapsulation layer 81 on the base substrate 50 is overlapped with an orthogonal projection of the light-emitting region of the light-emitting element EL on the base substrate 50. The orthographic projection of the first encapsulation climbing part 811 of the first encapsulation layer 81 on the base substrate 50 may be an annular structure surrounding the orthographic projection of the first encapsulation flat part 812 on the base substrate 50, and the orthographic projection of the second encapsulation climbing part 813 on the base substrate 50 may be an annular part surrounding the orthographic projection of the first encapsulation climbing part 811 on the base substrate 50. However, the present embodiment is not limited thereto.

In an exemplary implementation, the refractive index of the pixel define layer 72 may be about 1.4 to 2. The refractive index of the organic light-emitting layer 73 may be about 1.5 to 2.2. The refractive index of the first encapsulation layer 81 may be greater than that of the second encapsulation layer 82. For example, the difference between the refractive index of the first encapsulation layer 81 and the refractive index of the second encapsulation layer 82 may be greater than 0.1. For example, the refractive index of the first encapsulation layer 81 may be about 1.45 to 2.2, the refractive index of the second encapsulation layer 82 may be about 1.4 to 1.7, and the refractive index of the third encapsulation layer 83 may be about 1.45 to 2.2. However, the present embodiment is not limited thereto.

In some exemplary implementations, as shown in FIG. 7, in the direction perpendicular to the base substrate, a first height H1 of the surface of the first flat part 722 of the pixel define layer 72 away from the base substrate 50, to a surface close to the first electrode layer is related to the thickness of the first encapsulation layer 81. For example, the thickness of the first encapsulation layer 81 is about 1 micron (um), and the first height H1 of the first flat part 722 is not less than 200 nanometers (nm), for example, the first height H1 may be about 300 nm. A first height H2 of a surface of the second flat part 724 away from the base substrate 50, to the surface close to the first electrode layer may be about 2 um. A total thickness of the organic light-emitting layer 73 and the second electrode 74 of the light-emitting element EL may be about 200 nm. However, the present embodiment is not limited thereto.

In some exemplary implementations, as shown in FIG. 7, in a direction parallel to the base substrate, a first length W1 of the first flat part 722 is less than a first length of an adjacent opening. The first length is a dimension along the first direction, and the first direction is parallel to the plane where the base substrate is located and is intersected with the center line of the opening adjacent to the first flat part 722. For example, the first length W1 of the first flat part 722 may be about 800 nm. A first length W2 of the first slope 721 may be about 300 nm, and a first length W3 of the second climbing part 723 may be about 1700 nm. However, the present embodiment is not limited thereto.

In some exemplary implementations, two lights L1 and L2 shown in FIG. 7 are taken as examples. As shown in FIG. 7, after reflecting by the first encapsulation climbing part 811 of the first encapsulation layer 81 and the first flat part 722 of the pixel define layer 72, the light L1 emitted by the light-emitting element EL in a light-emitting area closest to the first flat part 722 of the pixel define layer 72 contacts the reflection surfaces of the first encapsulation layer 81 and the second encapsulation layer 82 in a large angle, so as to be confined in the encapsulation layer 80, thus avoiding color shift in a large viewing angle caused by the emission. After reflecting by the first encapsulation climbing part 811 of the first encapsulation layer 81, the first flat part 722 or the second climbing part 723 of the pixel define layer 72, and the second encapsulation climbing part 813 of the first encapsulation layer 81, the light L2 emitted by the light-emitting element EL in a light-emitting area farthest from the first flat part 722 of the pixel define layer 72 contacts the reflection surfaces of the first encapsulation layer 81 and the second encapsulation layer 82 in a large angle, so as to be confined in the encapsulation layer 80, thus avoiding color shift in a large viewing angle caused by the emission.

In this exemplary implementation, the first flat part 722 and the second climbing part 723 are formed at the edge of the pixel define layer 72 close to the opening, and the first encapsulation climbing part 811 and the second encapsulation climbing part 813 are correspondingly formed in the first encapsulation layer 81, so that the total reflection waveguide light in the first encapsulation layer 81 is confined in the encapsulation layer 80 and cannot be emitted, thereby alleviating color shift in a large viewing angle of the display substrate and enhancing the display effect.

A structure of a display substrate according to an embodiment in the present disclosure is described below with an example of a manufacturing process of a display substrate. A "patterning process" mentioned in the present disclosure includes film layer deposition, coating with a photoresist, masking, exposure, development, etching, photoresist stripping, and other treatment. Deposition may be any one or more of sputtering, evaporation, and chemical vapor deposition. Coating may be any one or more of spray coating and spin coating. Etching may be any one or more of dry etching and wet etching. "Thin film" refers to a layer of thin film fabricated by using a deposition or coating process to process a certain material on an base substrate. If the patterning process is not necessary for the "thin film" in the whole making process, the "thin film" may also be referred to as a "layer". If the patterning process is needed for the "thin film" in the whole making process, the thin film is referred to as a "thin film" before the patterning process and referred to as a "layer" after the patterning process. The "layer" after the patterning process includes at least one "pattern".

In the present disclosure, "A and B are provided on the same layer" means that A and B are formed at the same time by the same patterning process. "The same layer" does not always mean that the thickness of the layer or the height of the layer is the same in the sectional view. "The projection of A includes the projection of B" refers to that the projection of B falls in a range of the projection of A or the projection of A covers the projection of B.

In some exemplary implementations, the manufacturing process of the display substrate according to the present embodiment may include the following Steps.

In (1), a base substrate is provided.

In some exemplary implementations, the base substrate 50 may be a rigid substrate, e.g., a quartz substrate or a glass substrate, or may be a flexible substrate, e.g., an organic resin substrate. However, the present embodiment is not limited thereto.

In (2), a driving circuit layer is manufactured on the base substrate. The driving circuit layer includes a plurality of pixel driving circuits, each of the pixel driving circuits includes a plurality of transistors and at least one storage capacitor. As shown in FIG. 6, one sub-pixel is taken as an example, and the sub-pixel is illustrated only by one first transistor 601 and one storage capacitor 602 as an example.

In some exemplary implementations, a first insulation thin film and an active layer thin film are sequentially deposited on the base substrate 50 and the active layer thin film is patterned by a patterning process to form a first insulation layer 51 covering the entire base substrate 50 and an active layer pattern on the first insulation layer 51, the active layer pattern at least includes a first active layer.

Then, a second insulating film and a first metal film are sequentially deposited, and the first metal film is patterned by a patterning process to form a second insulating layer 52 covering the active layer pattern and a first gate metal layer pattern disposed on the second insulating layer 52, wherein the first gate metal layer pattern includes at least a first gate electrode and a first capacitor electrode.

Then, a third insulating film and a second metal film are sequentially deposited, and the second metal film is patterned by a patterning process to form a third insulating layer 53 covering the first gate metal layer and a second gate metal layer pattern disposed on the third insulating layer 53, wherein the second gate metal layer pattern includes at least a second capacitor electrode, and the position of the second capacitor electrode corresponds to that of the first capacitor electrode.

Then, a fourth insulation thin film is deposited and patterned by the patterning process to form a pattern of a fourth insulation layer 54 covering the second gate metal layer, the fourth insulation layer 54 is provided with at least two first via holes where the fourth insulation layer 54, the third insulation layer 53 and the second insulation layer 12 are etched, exposing the surface of the active layer 52.

Then, a third metal thin film is deposited and patterned by the patterning process, and a pattern of a source-drain metal layer is formed on the fourth insulating layer 54, and the source-drain metal layer at least includes a first source electrode and a first drain electrode. The first source electrode and the first drain electrode are connected to the first active layer by a first via hole, respectively.

As shown in FIG. 6, the first active layer, the first gate electrode, the first source electrode and the first drain electrode may form a first transistor 601, and the first capacitor electrode and the second capacitor electrode may form a storage capacitor 602.

In some exemplary implementations, the first insulating layer 51, the second insulating layer 52, the third insulating layer 53 and the fourth insulating layer 54 may be made of any one or more of silicon oxide (SiOx), silicon nitride (SiNx) and silicon oxynitride (SiON), and may be in a single layer structure, a multi-layer structure or a composite layer structure. The first insulating layer 51 is referred to as a buffer layer, which is used to improve the water and oxygen resistance of the base substrate; the second insulating layer 52 and the third insulating layer 53 are referred to as gate insulator (GI) layers; and the fourth insulating layer 54 is referred to as an interlayer dielectric (ILD) layer. The first metal thin film, the second metal thin film and the third metal thin film are made of a metal material, such as any one or more of silver (Ag), copper (Cu), aluminum (Al), titanium (Ti) and molybdenum (Mo), or an alloy material of the above metals, such as aluminum-neodymium alloy (AlNd) or molybdenum-niobium alloy (MoNb), which may be in a single-layer structure or multi-layer composite structure, such as Ti/Al/Ti. The active layer thin film is made of one or more of the materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology and organics technology.

In some exemplary implementations, a flat thin film of an organic material is coated on the base substrate on which the abovementioned patterns have been formed, so as to form a fifth insulating layer 55 covering the entire flexible substrate 50. A second via hole is formed on the fifth insulating layer 55 in the display area by masking, exposure and development processes. The fifth insulating layer 55 in the second via hole is developed to expose the surface of the first drain electrode of the first transistor 601 of the pixel driving circuit. The fifth insulating layer 55 can also be referred to as a Planarization (PLN) layer.

In (3), a pattern of the first control electrode is formed on the base substrate on which the aforementioned patterns are formed. In some examples, the first electrode is a reflective anode.

In some exemplary implementations, a conductive thin film is deposited on the base substrate 50 formed with the aforementioned patterns, and the conductive thin film is patterned through a patterning process to form the first electrode pattern. The first electrode 71 may connect to the first drain electrode of the first transistor 601 by the second via hole.

In some examples, the first electrode 71 may be made of metal material, such as any one or more of magnesium (Mg), silver (Ag), copper (Cu), aluminum (Al), titanium (Ti) and molybdenum (Mo), or alloy of the above metals, such as aluminum neodymium alloy (AlNd) or molybdenum niobium alloy (MoNb), which may be in a single-layered structure or a multi-layered composite structure, such as Ti/Al/Ti, or may be in a stack structure formed from metal and transparent conductive material, e.g. reflective material, such as ITO/Ag/ITO, Mo/AlNd/ITO, etc.

In (4), a pattern of the pixel define layer is formed on the base substrate on which the aforementioned patterns are formed.

In some exemplary implementations, a pixel define thin film is coated on the base substrate 50 on which the aforementioned patterns are formed, and a pattern of the pixel define layer 72 is formed through masking, exposure, and development processes. The pixel define layer 72 has an opening exposing the first electrode. In some examples, the first slope 721, the first flat part 722, the second climbing part 723 and the second flat part 724 of the pixel define layer 72 may be formed by the same mask with a plurality of light transmittance. However, the present embodiment is not limited thereto.

In some examples, the pixel define layer 72 may be made of polyimide, acrylic, polyethylene terephthalate, or the like.

In (5), an organic light-emitting layer and a second electrode are sequentially formed on the base substrate where the abovementioned patterns are formed. In some examples, the second electrode 74 may be a transparent cathode. By emitting from a side away from the base substrate 50 through transparent cathode, the light-emitting element may implement top emission. In some examples, the organic light-emitting layer of the light-emitting element may include a hole injection layer, a hole transport layer, an electron blocking layer, a light-emitting layer, a hole blocking layer, an electron transport layer, and an electron injection layer.

In some exemplary implementations, the hole injection layer, the hole transport layer, and the electron blocking layer are formed by sequential evaporation using an open mask on the base substrate 50 on which the aforementioned patterns are formed. Then, Fine Metal Mask (FMM) is used to sequentially evaporate to form light-emitting layers of different colors, e.g., a blue light-emitting layer, a green light-emitting layer and a red light-emitting layer. Then, the hole blocking layer, the electron transport layer and the electron injection layer are formed by sequential evaporation with an open mask. However, the present embodiment is not limited thereto.

In some exemplary implementations, the organic light-emitting layer may be formed in the opening of the pixel define layer, so that the organic light-emitting layer 73 is connected with the first electrode 71. The second electrode 74 is formed on the second flat part 724 of the pixel define layer 72 and connected with the organic light-emitting layer 73.

In some exemplary implementations, the second electrode 74 may be made of any one or more of magnesium (Mg), silver (Ag) and aluminum (Al), or an alloy made of any one or more of the above metals, or a transparent conductive material, e.g., indium tin oxide (ITO), or a multilayer composite structure of metals and transparent conductive materials. However, the present embodiment is not limited thereto.

In some exemplary implementations, an optical coupling layer (CPL) may be formed on a side of the second electrode 74 away from the base substrate 50, and the optical coupling layer may be a through layer of a plurality of sub-pixels. The optical coupling layer may cooperate with the transparent cathode to increase the light output. For example, the material of the optical coupling layer may be a semiconductor material. The refractive index of the optical coupling layer may be about 1.4 to 2.3. However, the present embodiment is not limited thereto.

In (6), an encapsulation layer is formed on the base substrate where the abovementioned patterns are formed.

In some exemplary implementations, an encapsulation layer 80 is formed on the base substrate where the abovementioned patterns are formed, and the encapsulation layer 80 includes a first encapsulation layer 81, a second encapsulation layer 82 and a third encapsulation layer 27 which are stacked. The first encapsulation layer 81 is made of inorganic material and covers the second electrode 73. The second encapsulation layer 82 is made of an organic material. The third encapsulation layer 83 is made of an inorganic material and covers the first encapsulation layer 81 and the second encapsulation layer 82. The first encapsulation layer 81 has a first encapsulation flat part 812, a first encapsulation climbing part 811, a second encapsulation climbing part 812 and a second encapsulation flat part 814. However, the present embodiment is not limited thereto. In some examples, the encapsulation layer 80 may be in a five-layer structure of inorganic/organic/inorganic/organic/inorganic.

According to the display substrate provided by this exemplary implementation, color shift of a large viewing angle of the display substrate is alleviated by improving the morphology of the pixel define layer and the first encapsulation layer.

The description of the structure and manufacturing process of the display substrate according to embodiments of the present disclosure is merely illustrative. In some exemplary implementations, changes in corresponding structures and addition or deletion of the patterning process may be made as practically required. For example, the driving circuit layer may include two source-drain metal layers, wherein the first electrode may be connected with the first drain electrode of the pixel driving circuit by a connecting electrode. However, the present embodiment is not limited thereto.

The structure (or method) shown in the present implementation may be combined with structures (or methods) shown in other implementations as appropriate.

Figure 8:
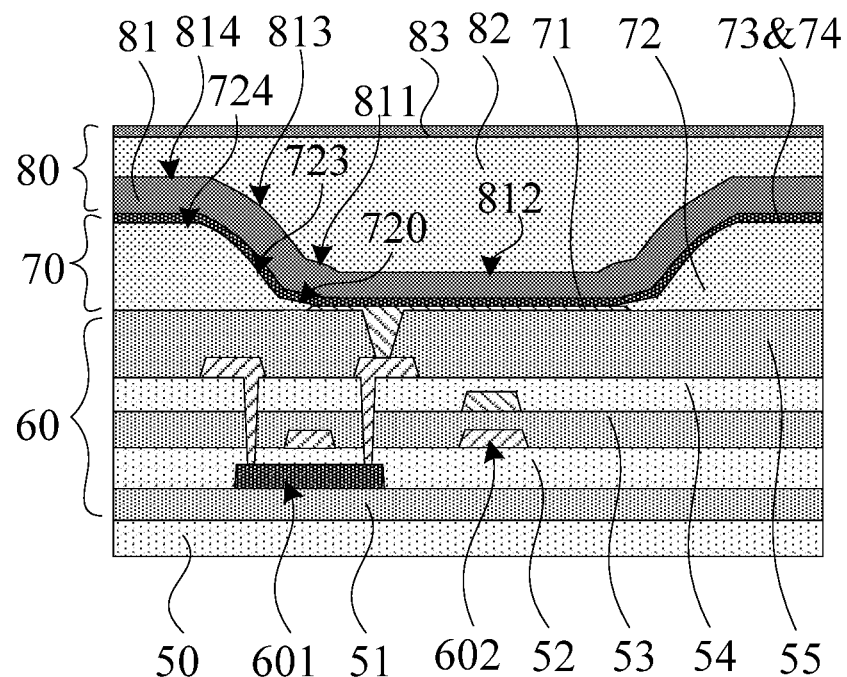
FIG. 8 is another partial sectional schematic diagram of a display substrate according to at least one embodiment of the present disclosure.
Figure 9:
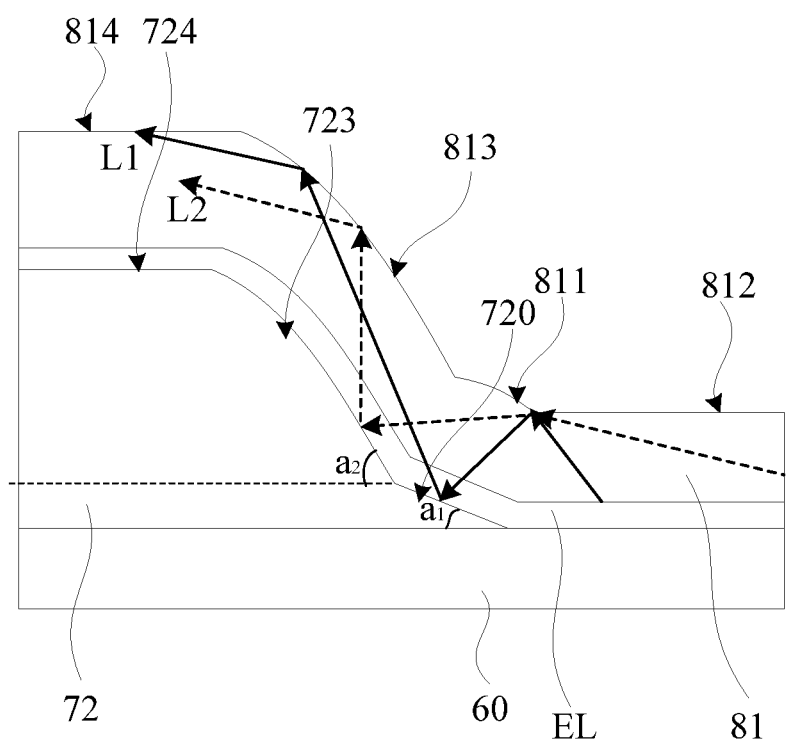
FIG. 9 is another schematic diagram of a light path according to at least one embodiment of the present disclosure.

FIG. 8 is another schematic partial sectional view of a display substrate according to at least one embodiment of the present disclosure, which illustrates a structure of a sub-pixel. FIG. 9 is another schematic diagram of a light path according to at least one embodiment of the present disclosure.

In some exemplary implementations, as shown in FIGS. 8 and 9, the pixel define layer 72 has a first climbing part 720, a second climbing part 723 and a second flat part 724 connected sequentially at an edge close to the opening. The first climbing part 720 is close to the first electrode 71. The distance from a surface of the second flat part 724 away from the base substrate 50 to the base substrate 50 is greater than the distance from a surface of the second climbing part 723 away from the base substrate 50 to the base substrate 50. The distance from a surface of the second climbing part 723 away from the base substrate 50 to the base substrate 50 is greater than the distance from a surface of the first climbing part 720 away from the base substrate 50 to the base substrate 50. In this example, as shown in FIG. 9, the first climbing part 720 has a first slope angle a1, and the second climbing part 723 has a second slope angle a2. In this example, the first slope angle a1 of the first climbing part 720 is an included angle between the tangent of a plane where the first climbing part 720 is located and the plane parallel to the base substrate. The second slope angle a2 of the second climbing part 723 is an included angle between the tangent of a plane where the second climbing part 723 is located and the plane parallel to the base substrate. The first slope angle a1 is less than the second slope angle a2.

In some exemplary implementations, as shown in FIGS. 8 and 9, the orthographic projections of the first climbing part 720, the second climbing part 723 and the second flat part 724 on the base substrate 50 are not overlapped. In a direction parallel to the display substrate, the orthographic projection of the first climbing part 720 on the base substrate 50 may be an annular structure surrounding the light-emitting area of the light-emitting element EL, and the orthographic projection of the second climbing part 723 on the base substrate 50 may be an annular structure surrounding the orthographic projection of the first climbing part 720 on the base substrate 50. However, the present embodiment is not limited thereto.

In some exemplary implementations, as shown in FIGS. 8 and 9, the first encapsulation layer 81 may have a first encapsulation flat part 812, a first encapsulation climbing part 811, a second encapsulation climbing part 813 and a second encapsulation flat part 814 connected in sequence. For example, the slope angle of the first encapsulation climbing part 811 is less than that of the second encapsulation climbing part 813. The orthographic projection of the first encapsulation climbing part 811 on the base substrate 50 is partially overlapped with that of the first climbing part 720 on the base substrate 50. The orthographic projection of the second encapsulation climbing part 813 on the base substrate 50 is partially overlapped with orthographic projections of the first climbing part 720 and the second climbing part 723 on the base substrate 50. However, the present embodiment is not limited thereto.

In this exemplary implementation, as shown in FIG. 9, after reflecting by the first encapsulation climbing part 811 of the first encapsulation layer 81 and the first climbing part 720 of the pixel define layer 72, the light L1 emitted by the light-emitting element EL in a light-emitting area close to the pixel define layer 72 contacts the reflection surfaces of the first encapsulation layer 81 and the second encapsulation layer 82 in a large angle, so as to be confined in the encapsulation layer 80, thus avoiding color shift in a large viewing angle caused by the emission. After reflecting by the first encapsulation climbing part 811 of the first encapsulation layer 81 and the second climbing part 723 of the pixel define layer 72, the light L2 emitted by the light-emitting element EL in a light-emitting area away from the pixel define layer 72 contacts the reflection surfaces of the first encapsulation layer 81 and the second encapsulation layer 82 in a large angle, so as to be confined in the encapsulation layer 80, thus avoiding color shift in a large viewing angle caused by the emission.

With regard to other structure of the display substrate of the present embodiment, reference may be made to the description of the above embodiment, so it will not be repeated here. The structure (or method) shown in the present implementation may be combined with structures (or methods) shown in other implementations as appropriate.

Figure 10:
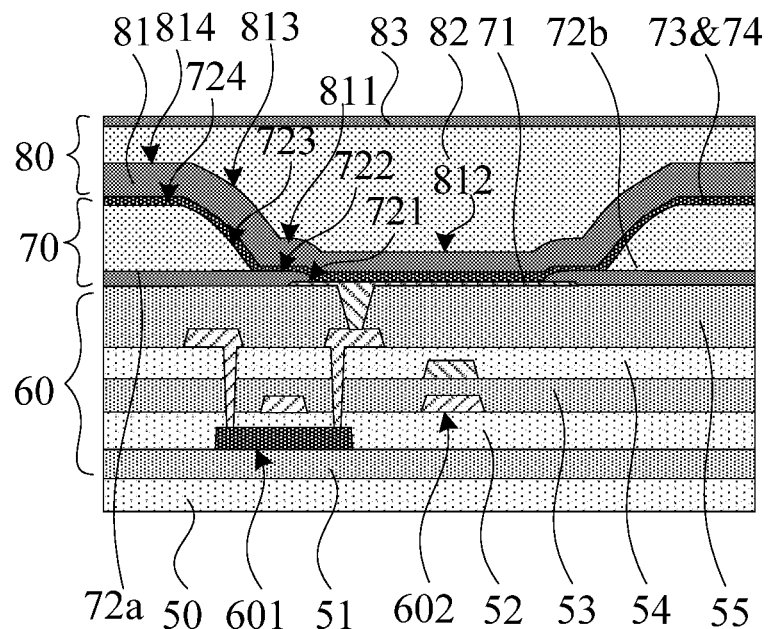
FIG. 10 is another partial sectional schematic diagram of a display substrate according to at least one embodiment of the present disclosure.

FIG. 10 is another schematic partial sectional view of a display substrate according to at least one embodiment of the present disclosure, which illustrates a structure of a sub-pixel. In some exemplary implementations, as shown in FIG. 10, a first pixel define layer 72*a* and a second pixel define layer 72*b* are sequentially stacked on the side of the first electrode 71 away from the base substrate 50. The first pixel define layer 72*a* has a plurality of first openings, and the second pixel define layer 72*b* has a plurality of second openings corresponding to the plurality of first openings one by one. The first openings communicate with the corresponding second openings to expose the first electrode 71. The first pixel define layer 72*a* has a first step close to an edge of the first opening, and the first step has a first slope 721 and a first flat part 722. The second pixel define layer 72*b* has a second step close to the edge of the second opening, and the second step has a second climbing part 723 and a second flat part 724. In this example, both the first step and the second step may be trapezoidal in a direction perpendicular to the base substrate. The first encapsulation layer 81 has a first encapsulation flat part 812, a first encapsulation climbing part 811, a second encapsulation climbing part 813 and a second encapsulation flat part 814.

In some exemplary implementations, the material of the first pixel define layer 72*a* is different from that of the second pixel define layer 72*b*. For example, the first pixel define layer 72*a* and the second pixel define layer 72*b* may be of different organic materials.

With regard to other structure and description of light path of the display substrate of the present embodiment, reference may be made to the description of the above embodiment, so it will not be repeated here. The structure (or method) shown in the present implementation may be combined with structures (or methods) shown in other implementations as appropriate.

Figure 11:
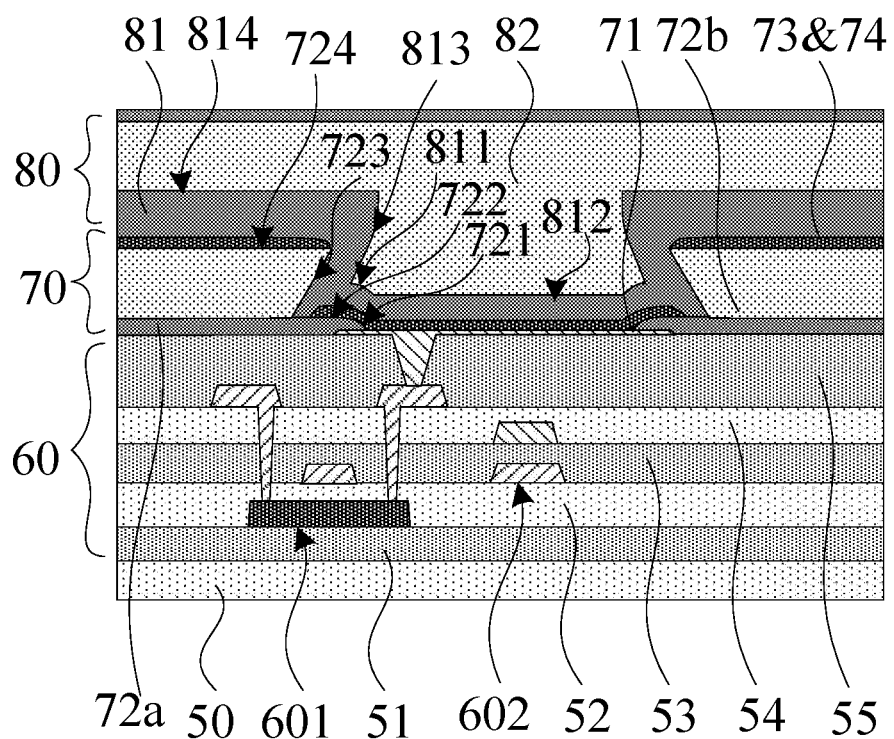
FIG. 11 is another partial sectional schematic diagram of a display substrate according to at least one embodiment of the present disclosure.
Figure 12:
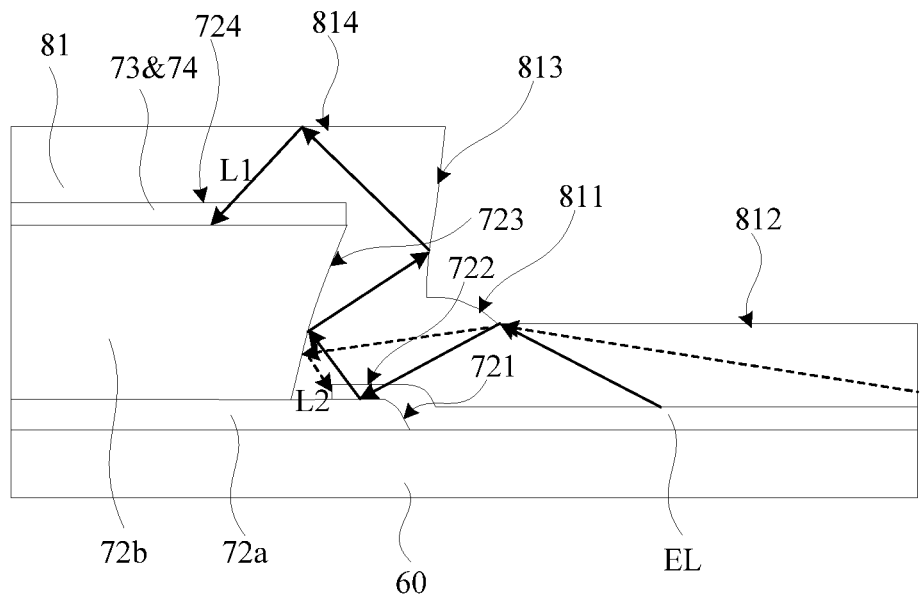
FIG. 12 is another schematic diagram of a light path according to at least one embodiment of the present disclosure.

FIG. 11 is another schematic partial sectional view of a display substrate according to at least one embodiment of the present disclosure, which illustrates a structure of a sub-pixel. FIG. 12 is schematic diagram of another light path according to at least one embodiment of the present disclosure.

In some exemplary implementations, as shown in FIGS. 11 and 12, the first pixel define layer 72*a* has a first step close to an edge of the first opening, and the first step has a first slope 721 and a first flat part 722. The second pixel define layer 72*b* has a second step close to the edge of the second opening, and the second step has a second climbing part 723 and a second flat part 724. In this example, in the direction perpendicular to the base substrate, the first step may be trapezoidal and the second step may be inverted trapezoidal. Herein, the orthographic projection of the second flat part 724 on the base substrate 50 may cover the orthographic projection of the second climbing part 723 on the base substrate 50 and is overlapped with the orthographic projection of the first flat part 722 on the base substrate 50. However, the present embodiment is not limited thereto. For example, the orthographic projection of the second flat part 724 on the base substrate 50 may cover the orthographic projections of the second climbing part 723 and the first flat part 722 on the base substrate 50.

In some exemplary implementations, as shown in FIGS. 11 and 12, the first encapsulation layer 81 has a first encapsulation flat part 812, a first encapsulation climbing part 811, a second encapsulation climbing part 813 and a second encapsulation flat part 814. The orthographic projection of the second encapsulation flat part 814 on the base substrate 50 may cover the orthographic projection of the second encapsulation climbing part 813 on the base substrate 50 and is overlapped with the orthographic projection of the first encapsulation climbing part 811 on the base substrate 50. The orthographic projection of the first encapsulation climbing part 811 on the base substrate 50 is overlapped with the orthographic projection of the first step of the pixel define layer 72 on the base substrate 50. However, the present embodiment is not limited thereto.

In this exemplary implementation, as shown in FIG. 12, after reflecting by the first encapsulation climbing part 811 of the first encapsulation layer 81 and the first climbing part 722 of the pixel define layer 72, the emission direction of the light L1 emitted by the light-emitting element EL in a light-emitting area close to the pixel define layer 72 changes, so as to be confined in the encapsulation layer 80, thus avoiding color shift in a large viewing angle caused by the emission. After reflecting by the first encapsulation climbing part 811 of the first encapsulation layer 81 and the second climbing part 723 of the pixel define layer 72, the emission direction of the light L2 emitted by the light-emitting element EL in a light-emitting area away from the pixel define layer 72 changes, thus avoiding large viewing angle color shift caused by the emission.

With regard to other structure of the display substrate of the present embodiment, reference may be made to the description of the above embodiment, so it will not be repeated here. The structure (or method) shown in the present implementation may be combined with structures (or methods) shown in other implementations as appropriate.

Figure 13:
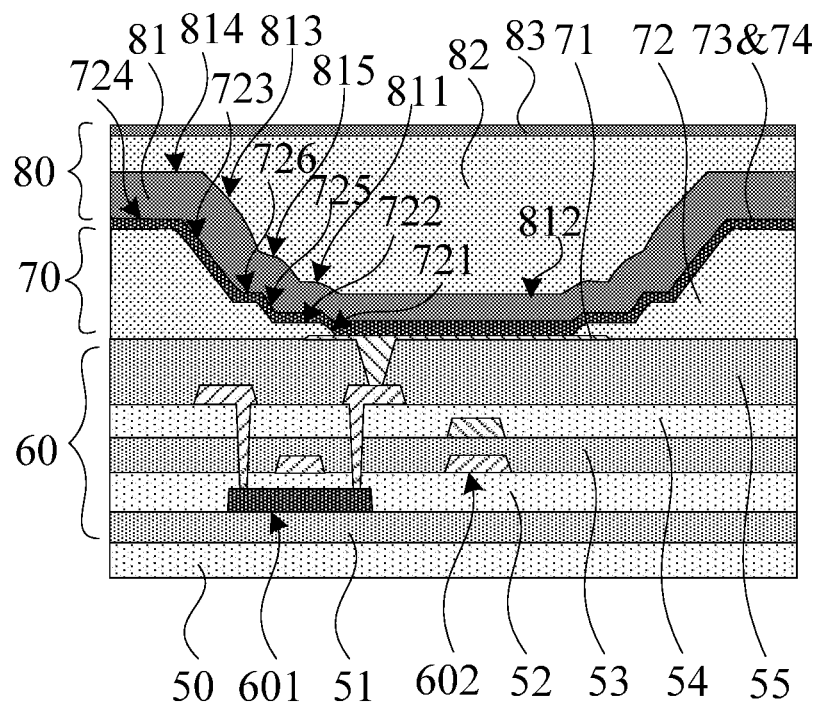
FIG. 13 is another partial sectional schematic diagram of a display substrate according to at least one embodiment of the present disclosure.
Figure 14:
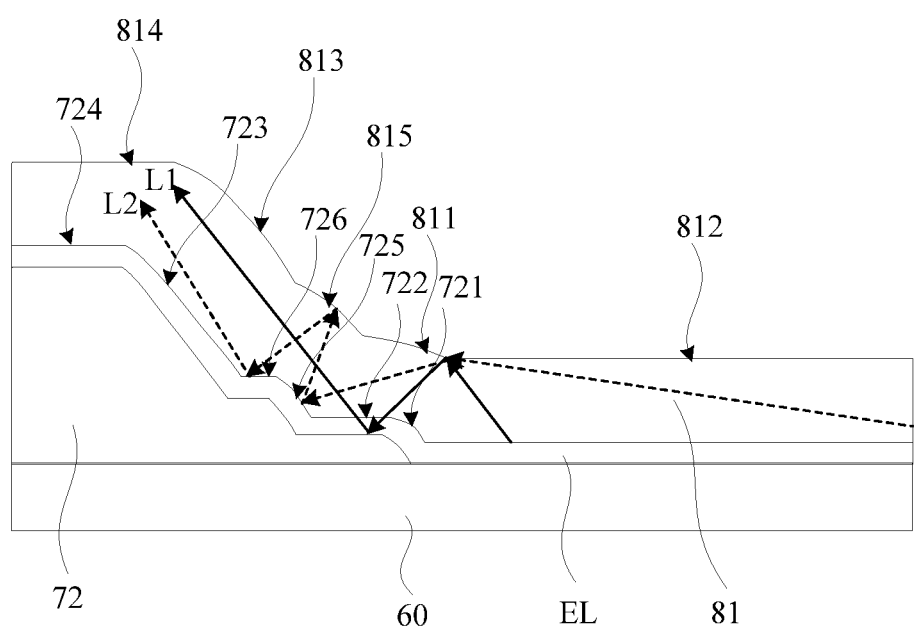
FIG. 14 is another schematic diagram of a light path according to at least one embodiment of the present disclosure.

FIG. 13 is another schematic partial sectional view of a display substrate according to at least one embodiment of the present disclosure, which illustrates a structure of a sub-pixel. FIG. 14 is schematic diagram of another light path according to at least one embodiment of the present disclosure.

In some exemplary implementations, the pixel define layer 72 has a first climbing part, a second climbing part 723 and a second flat part 724 connected sequentially at an edge close to the opening. The first climbing part has two first steps disposed in sequence along the direction away from adjacent openings, that is, the first climbing part has a first slope 721, a first flat part 722, a second slope 725 and a third flat part 726 connected in sequence. The first slope 721 and the first flat part 722 form a first first step, and the second slope 725 and the third flat part 726 form a second first step. The second climbing part 723 and the second flat part 724 form a second step. In this example, in the direction perpendicular to the base substrate, the two first steps and the two second steps may be trapezoidal in different dimensions.

In some exemplary implementations, as shown in FIGS. 13 and 14, the first encapsulation layer 81 may have a first encapsulation flat part 812, a first encapsulation climbing part 811, a third encapsulation climbing part 815, a second encapsulation climbing part 813 and a second encapsulation flat part 814 connected in sequence. The orthographic projection of the first encapsulation climbing part 811 on the base substrate 50 is overlapped with the orthographic projection of the first first step on the base substrate 50, the orthographic projection of the third encapsulation climbing part 815 is overlapped with the orthographic projection of the second first step on the base substrate 50, and the orthographic projection of the second encapsulation climbing part 813 on the base substrate 50 is overlapped with the orthographic projection of the second step and the second first step on the base substrate 50. However, the present embodiment is not limited thereto.

In this exemplary implementation, as shown in FIG. 14, after reflecting by the first encapsulation climbing part 811 of the first encapsulation layer 81 and the first first step of the pixel define layer 72, the light L1 emitted by the light-emitting element EL in a light-emitting area close to the pixel define layer 72 contacts the reflection surfaces of the first encapsulation layer 81 and the second encapsulation layer 82 in a large angle, so as to be confined in the encapsulation layer 80, thus avoiding color shift in a large viewing angle caused by the emission. After reflecting by the first encapsulation climbing part 811 of the first encapsulation layer 81 and the second first step of the pixel define layer 72, the light L2 emitted by the light-emitting element EL in the light-emitting area away from the pixel define layer 72 contacts the reflection surfaces of the first encapsulation layer 81 and the second encapsulation layer 82 at a large angle, so that it is confined in the encapsulation layer 80, thus avoiding color shift in a large viewing angle caused by the emission.

With regard to other structure of the display substrate of the present embodiment, reference may be made to the description of the above embodiment, so it will not be repeated here. The structure (or method) shown in the present implementation may be combined with structures (or methods) shown in other implementations as appropriate.

The embodiment of the present disclosure provides a manufacturing method of a display substrate, which includes forming a first electrode layer, a pixel define layer, an organic light-emitting layer, a second electrode layer and a first encapsulation layer sequentially on an base substrate. Wherein, the pixel define layer has a plurality of openings, at least one of which exposes the first electrode layer. The pixel define layer has a first climbing part and a second climbing part close to the edge of at least one opening, the distance from a surface of the second climbing part away from the base substrate to the base substrate is greater than the distance from a surface of the first climbing part away from the base substrate to the base substrate, and the slope angle of the first climbing part is different from that of the second climbing part. The first encapsulation layer has a first encapsulation climbing part and a second encapsulation climbing part, the distance from a surface of the second encapsulation climbing part away from the base substrate to the base substrate is greater than the distance from a surface of the first encapsulation climbing part away from the base substrate to the base substrate, and the slope angle of the first encapsulation climbing part is different from that of the second encapsulation climbing part. The slope angle is an angle between the tangent of the climbing part and a plane parallel to the base substrate.

The manufacturing method of the display substrate in the present embodiment may refer to the description in the abovementioned embodiments, and thus will not be elaborated herein.

At least one embodiment of the present disclosure further provides a display apparatus which includes display substrates of above embodiments. In some examples, the display substrate may be an OLED display substrate. The display apparatus may be any product or component with a display function, such as a mobile phone, a tablet computer, a television, a display, a laptop computer, a digital photo frame, or a navigator. However, the present embodiment is not limited thereto.

The drawings of the present disclosure only involve the structures involved in the present disclosure, and the other structures may refer to conventional designs. The embodiments in the present disclosure, i.e., the features in the embodiments, can be combined to obtain new embodiments if there are no conflicts.

Those of ordinary skill in the art should know that modifications or equivalent replacements may be made to the technical solutions of the present disclosure without departing from the spirit and scope of the technical solutions of the present disclosure, and shall all fall within the scope of the claims of the present disclosure.

The invention claimed is:
1. A display substrate, comprising:
    a first electrode layer, a pixel define layer, an organic light-emitting layer, a second electrode layer and a first encapsulation layer which are sequentially disposed away from an base substrate;
    wherein:
    the pixel define layer comprises a plurality of openings, at least one of which exposes the first electrode layer;
    the pixel define layer comprises a first climbing part and a second climbing part close to the edge of at least one opening, a distance from a surface of the second climbing part away from the base substrate to the base substrate is greater than a distance from a surface of the first climbing part away from the base substrate to the base substrate, and a slope angle of the first climbing part is different from a slope angle of the second climbing part;
    the first encapsulation layer comprises a first encapsulation climbing part and a second encapsulation climbing part, a distance from a surface of the second encapsulation climbing part away from the base substrate to the base substrate is greater than a distance from a surface of the first encapsulation climbing part away from the base substrate to the base substrate, and a slope angle of the first encapsulation climbing part is different from a slope angle of the second encapsulation climbing part;
the slope angle is an included angle between a tangent of the climbing part and a plane parallel to the base substrate;
the first climbing part comprises at least one first step;
the first step comprises a first flat part and a first slope, and the first flat part is connected between the first slope and the second climbing part; and
a thickness of the first encapsulation layer is about 600 nanometers to 3 microns; in a direction perpendicular to the base substrate, a distance from a surface of the first flat part away from the base substrate to the first electrode layer is greater than or equal to 200 nanometers.

2. The display substrate according to claim 1, wherein the slope angle of the first climbing part is less than that of the second climbing part.

3. The display substrate according to claim 1, wherein the orthographic projection of the first encapsulation climbing part on the base substrate is at least partially overlapped with the orthographic projection of the first climbing part on the base substrate.

4. The display substrate according to claim 1,
wherein the orthographic projection of the first encapsulation climbing part of the first encapsulation layer on the base substrate is at least partially overlapped with an orthographic projection of the first step on the base substrate.

5. The display substrate according to claim 4, wherein the first climbing part comprises a plurality of first steps disposed in sequence in a direction away from adjacent openings;
the first encapsulation layer further comprises at least one third encapsulation climbing part connected between the second encapsulation climbing part and the first encapsulation climbing part; and
an orthographic projection of the third encapsulation climbing part on the base substrate is overlapped with an orthographic projection of at least one first step on the base substrate.

6. The display substrate according to claim 1, wherein in a direction parallel to the display substrate, a first length of the first flat part is less than a first length of an adjacent opening;
the first length is a dimension along a first direction, and the first direction is parallel to a plane where the base substrate is located and is intersected with a center line of the opening.

7. The display substrate according to claim 1, wherein the pixel define layer further comprises a second flat part close to the edge of at least one opening, and the second flat part is connected with the second climbing part; a distance from a surface of the second flat part away from the base substrate to the base substrate is greater than a distance from a surface of the second climbing part away from the base substrate to the base substrate.

8. The display substrate according to claim 7, wherein an orthographic projection of the second flat part on the base substrate is not overlapped with an orthographic projection of the second climbing part on the base substrate.

9. The display substrate according to claim 7, wherein an orthographic projection of the second flat part on the base substrate contains an orthographic projection of the second climbing part on the base substrate.

10. The display substrate according to claim 1, wherein the pixel define layer includes a first pixel define layer and a second pixel define layer which are stacked, wherein the first pixel define layer comprises a plurality of first openings and the second pixel define layer comprises a plurality of second openings, and the plurality of first openings and the plurality of second openings are correspondingly communicated one by one and expose the first electrode layer;
the first pixel define layer comprises at least a one first climbing part close to an edge of at least one first opening, and the second pixel define layer comprises at least a one second climbing part close to an edge of at least one second opening.

11. The display substrate according to claim 10, wherein the first pixel define layer and the second pixel define layer are made of different materials.

12. The display substrate according to claim 1, wherein the first encapsulation layer further comprises a first encapsulation flat part and a second encapsulation flat part, wherein the first encapsulation flat part is connected with the first encapsulation climbing part and the second encapsulation flat part is connected with the second encapsulation climbing part;
a distance from a surface of the first encapsulation flat part away from the base substrate to the base substrate is less than a distance from a surface of the first encapsulation climbing part away from the base substrate to the base substrate; and
a distance from a surface of the second encapsulation flat part away from the base substrate to the base substrate is greater than a distance from a surface of the second encapsulation climbing part away from the base substrate to the base substrate.

13. The display substrate according to claim 1, further comprising: a second encapsulation layer located at a side of the first encapsulation layer away from the base substrate;
the first encapsulation layer is made of inorganic material, the second encapsulation layer is made of organic material, and the refractive index of the first encapsulation layer is higher than that of the second encapsulation layer.

14. The display substrate according to claim 1, wherein a refractive index range of the pixel define layer is about 1.4 to 2, and a refractive index range of the first encapsulation layer is about 1.45 to 2.2.

15. A display apparatus, comprising the display substrate according to claim 1.

16. A preparing method for a display substrate, comprising:
forming a first electrode layer, a pixel define layer, an organic light-emitting layer, a second electrode layer and a first encapsulation layer sequentially on an base substrate;
wherein the pixel define layer comprises a plurality of openings, at least one of which exposes the first electrode layer;
the pixel define layer comprises a first climbing part and a second climbing part close to an edge of at least one opening, a distance from a surface of the second climbing part away from the base substrate to the base substrate is greater than a distance from a surface of the first climbing part away from the base substrate to the base substrate, and of the first climbing part is different from a slope angle of the second climbing part;
the first encapsulation layer comprises a first encapsulation climbing part and a second encapsulation climbing part, a distance from a surface of the second encapsulation climbing part away from the base substrate to the base substrate is greater than a distance from a surface of the first encapsulation climbing part away from the base substrate to the base substrate, and a slope angle of the first encapsulation climbing part is different from a slope angle of the second encapsulation climbing part; the slope angle is an included angle between a tangent of the climbing part and a plane parallel to the base substrate;

the first climbing part comprises at least one first step;

the first step comprises a first flat part and a first slope, and the first flat part is connected between the first slope and the second climbing part; and a thickness of the first encapsulation layer is about 600 nanometers to 3 microns; in a direction perpendicular to the base substrate, a distance from a surface of the first flat part away from the base substrate to the first electrode layer is greater than or equal to 200 nanometers.

* * * * *